US009681595B2

(12) United States Patent
Tanazawa et al.

(10) Patent No.: US 9,681,595 B2
(45) Date of Patent: Jun. 13, 2017

(54) COVER TAPE

(75) Inventors: Yusuke Tanazawa, Isesaki (JP); Takeshi Ono, Isesaki (JP)

(73) Assignee: DENKA COMPANY LIMITED, Tokyo (JP)

( * ) Notice: Subject to any disclaimer, the term of this patent is extended or adjusted under 35 U.S.C. 154(b) by 641 days.

(21) Appl. No.: 14/126,325

(22) PCT Filed: Jun. 12, 2012

(86) PCT No.: PCT/JP2012/065030
§ 371 (c)(1),
(2), (4) Date: Dec. 13, 2013

(87) PCT Pub. No.: WO2012/173119
PCT Pub. Date: Dec. 20, 2012

(65) Prior Publication Data
US 2014/0134365 A1 May 15, 2014

(30) Foreign Application Priority Data
Jun. 14, 2011 (JP) ................. 2011-132106

(51) Int. Cl.
| B32B 27/08 | (2006.01) |
| H05K 13/00 | (2006.01) |
| B32B 25/08 | (2006.01) |
| B32B 27/30 | (2006.01) |
| B32B 27/32 | (2006.01) |
| B32B 27/36 | (2006.01) |

(52) U.S. Cl.
CPC ......... *H05K 13/0084* (2013.01); *B32B 25/08* (2013.01); *B32B 27/08* (2013.01); *B32B 27/302* (2013.01); *B32B 27/32* (2013.01); *B32B 27/36* (2013.01); *B32B 2250/05* (2013.01); *B32B 2255/10* (2013.01); *B32B 2255/24* (2013.01); *B32B 2255/26* (2013.01); *B32B 2270/00* (2013.01); *B32B 2307/21* (2013.01); *B32B 2307/412* (2013.01); *B32B 2307/518* (2013.01); *B32B 2307/748* (2013.01); *B32B 2405/00* (2013.01); *B32B 2435/00* (2013.01); *B32B 2435/02* (2013.01); *B32B 2553/00* (2013.01); *Y10T 428/1352* (2015.01); *Y10T 428/265* (2015.01); *Y10T 428/31938* (2015.04)

(58) Field of Classification Search
CPC ............ B32B 2250/05; B32B 2255/10; B32B 2255/24; B32B 2255/26; B32B 2270/00; B32B 2307/21; B32B 2307/412; B32B 2307/518; B32B 2307/748; B32B 2405/00; B32B 2435/00; B32B 2435/02; B32B 2553/00; B32B 25/08; B32B 27/08; B32B 27/302; B32B 27/32; B32B 27/36; Y10T 428/1352; Y10T 428/265; Y10T 428/31938
USPC ........................................ 428/336, 35.7, 523
See application file for complete search history.

(56) References Cited

U.S. PATENT DOCUMENTS

| 3,630,740 A * | 12/1971 | Joseph ..................... G03C 1/79 260/DIG. 15 |
| 2003/0129389 A1 | 7/2003 | Ichikawa et al. |
| 2007/0184243 A1* | 8/2007 | Ono ......................... B32B 7/02 428/141 |

FOREIGN PATENT DOCUMENTS

| EP | 1741640 A1 | 1/2007 |
| JP | A-7-172463 | 7/1995 |
| JP | A-7-251860 | 10/1995 |
| JP | A-11-115088 | 4/1999 |
| JP | A-2003-266016 | 9/2003 |
| JP | A-2003-281934 | 10/2003 |
| JP | A-2003-311720 | 12/2003 |
| JP | A-2005-225548 | 8/2005 |
| JP | 2006-104344 A | 4/2006 |
| JP | A-2006-264719 | 10/2006 |
| JP | A-2010-121093 | 6/2010 |

OTHER PUBLICATIONS

International Search Report issued in International Patent Application No. PCT/JP2012/065030 dated Sep. 18, 2012.
Apr. 2, 2015 Extended European Search Report issued in European Application No. 12 80 0145.0.

* cited by examiner

*Primary Examiner* — Yan Lan
(74) *Attorney, Agent, or Firm* — Oliff PLC

(57) ABSTRACT

The present invention relates to a cover tape and to an electronic component package that uses the cover tape, the cover tape including at least a substrate layer, a heat seal layer, and an antistatic layer, the antistatic layer containing (A) an ionic liquid including a cyclic quaternary nitrogen-containing cation, (B) a quaternary ammonium salt, and (C) a polyalkylene glycol being formed on a surface toward the heat seal layer, and an anion constituting the (A) ionic liquid including a cyclic quaternary nitrogen-containing cation and the (B) quaternary ammonium salt being one or more anions selected from the group consisting of carboxylic acids, sulfuric acid esters, phosphoric acid esters, sulfonic acids, and phosphoric acids.

15 Claims, No Drawings

COVER TAPE

TECHNICAL FIELD

The present invention relates to a cover tape used as a lid material for carrier tape used to transport chip-type electronic components until they are mounted on substrates.

BACKGROUND ART

When transporting chip-type electronic components such as ICs, carrier tapes are generally used. In other words, the aforementioned chip-type electronic components are inserted into dimples for housing electronic components formed at standard intervals on the carrier tape, the top surface of the carrier tape is heat sealed with cover tape having an easily peelable adhesive layer on a substrate to seal the electronic components, then wound into a reel for transport. While the aforementioned cover tape must be transparent enough to enable inspection of the electronic components and to enable it to be smoothly peeled from the carrier tape with ease, if the electronic components are also components that easily undergo insulation breakdown due to static electricity from ICs or the like, one or both surfaces of the cover tape may be treated with an antistatic treatment in order to prevent adherence of dust, protect the contents from static electricity, and prevent problems such as the electronic components sticking to the cover tape and flying out when the cover tape is peeled from the carrier tape.

The antistatic treatment may be performed using a method such as blending an antistatic agent into the resin forming the surface to be static-proofed, or by thinly coating the surface with an antistatic agent. Examples having an antistatic agent coated onto the surface of an adhesive layer (or heat seal layer) are disclosed in Patent Documents 1 and 2.

With these methods, antistatic agent must be coated in bulk to obtain sufficient antistatic effects, and when placed in a high-temperature high-humidity environment while heat sealed to carrier tape, they attract oxygen and moisture from the air, causing reductions in the adhesive force of the cover tape as a result of which vibrations during transport and mounting can cause the cover tape to peel, and the electronic components may spill out.

Additionally, methods of static-proofing cover tape by coating the surface of the adhesive layer (heat seal layer or sealant layer etc.) with a coating containing conductive microparticles have been proposed (e.g., Patent Documents 3, 4 and 5). However, with these methods, it is not easy to evenly disperse microparticles in the resin components forming the coating material, and this not only complicates the manufacturing process and reduces productivity, but also causes dispersion defects. Additionally, in the latter method wherein an antistatic agent is kneaded in, sufficient surface resistance cannot be obtained, and mixing metal microparticles may cause the transparency to drop, making it difficult to achieve enough transparency to be able to observe printing or the shapes of contents through the cover tape.

On the other hand, in recent years, a coating-type antistatic agent using an ionic liquid has been proposed for static-proofing films or sheets in general (e.g., Patent Document 6). However, there do not seem to be any documents that disclose coating the surface of the heat seal layer of cover tape, or its effect on peel strength.

Patent Document 1: JP H7-172463 A
Patent Document 2: JP 2005-225548 A
Patent Document 3: JP H11-115088 A
Patent Document 4: JP H7-251860 A
Patent Document 5: JP 2003-266016 A
Patent Document 6: JP 2010-121093 A

SUMMARY OF THE INVENTION

The present invention addresses the problem of offering a cover tape used in a lid material for a container such as carrier tape for housing components and a chip-type electronic component package using said cover tape, wherein the cover tape has good transparency and sufficient antistatic properties, and when housing and storing components, is capable of sufficiently suppressing decreases in peel strength with respect to carrier tape even when used in high-temperature high-humidity environments, and does not cause problems such as corrosion of the contents.

As a result of diligent consideration of the aforementioned problem, the present inventors discovered that decreases in peel strength can be sufficiently suppressed even in high-temperature high-humidity environments, by forming an antistatic layer containing a specific antistatic agent comprising an ionic liquid on a surface on a heat seal layer side, thereby achieving the present invention.

That is, in one aspect, the present invention relates to a cover tape comprising at least a substrate layer, a heat seal layer and an antistatic layer, wherein the antistatic layer comprises (A) an ionic liquid containing a cyclic quaternary nitrogen-containing cation, (B) a quaternary ammonium salt and (C) a polyalkylene glycol, and is formed on the surface on the heat seal layer side. In one embodiment, anions in (A) the ionic liquid containing a cyclic quaternary nitrogen-containing cation and (B) the quaternary ammonium salt are preferably of one or more types chosen from the group consisting of carboxylic acids, sulfuric acid esters, phosphoric acid esters, sulfonic acids and phosphoric acids. In another embodiment, the ratios of the content of the components of the antistatic layer are preferably 10 to 80 mass % of component (A), 5 to 70 mass % of component (B) and 5 to 50 mass % of component (C).

In one embodiment, (A) the ionic liquid containing a cyclic quaternary nitrogen-containing cation is preferably an imidazolium salt. In another embodiment, the cations in (B) the quaternary ammonium salt should preferably have one alkyl group or alkenyl group having 10 to 20 carbon atoms. In a further embodiment, (C) the polyalkylene glycol should preferably be a polyethylene glycol having a mass-average molecular weight (Mw) of 200 to 600. In yet another embodiment, the thickness of the antistatic layer on the surface on the heat seal side is 0.01 to 0.2 μm.

Furthermore, in another aspect, the present invention relates to an electronic component package using one of the aforementioned cover tapes.

The cover tape of the present invention is a cover tape having transparency that can be easily peeled from carrier tape, has sufficient antistatic effects and anti-rust effects, and is capable of suppressing decreases in adhesive force of the cover tape and notably suppressing spillage of electronic components due to vibrations during transport or mounting even when housing and storing electronic components in high-temperature high-humidity environments.

MODES FOR CARRYING OUT THE INVENTION

The cover tape of the present invention comprises at least a substrate layer, a heat seal layer and an antistatic layer. In other words, it may have a three-layered structure of a substrate layer, a heat seal layer and an antistatic layer, or it may have a multilayered structure with one or more intermediate layers between these layers. In the case of a multilayered structure, an antistatic layer containing an antistatic agent comprising (A) an ionic liquid containing a cyclic quaternary nitrogen-containing cation, (B) a quaternary ammonium salt and (C) a polyalkylene glycol is formed on the surface on the heat seal layer side.

Herebelow, each layer will be described in detail.

<Substrate Layer>

The substrate layer comprises a thermoplastic resin, and is preferably, for example, a film, particularly a biaxially stretched film, produced from a thermoplastic resin which may be a polyester such as polyethylene terephthalate or polyethylene napththalate, a polyolefin such as polypropylene, a polyamide such as nylon, or a polycarbonate. It is preferably a biaxially stretched polyethylene terephthalate film, and in any case, a commercially available film may be used. While the thickness of the substrate layer is not particularly limited, one with a thickness of 5 to 50 μm should generally be used.

The side of the substrate that is to contact the heat seal layer or intermediate layer may be surface-treated by sand-blasting, corona discharge, or plasma treatment to enhance the adhesive strength with the heat seal layer or intermediate layer and stabilize. Additionally, an antistatic agent can be kneaded into the substrate layer, or an antistatic product coated with an antistatic agent may be used on the surface on the side that is to form the outer surface of the cover tape. Additionally, an anchor coating agent may be provided on the surface of the substrate layer for the purpose of raising the adhesive force when laminating an intermediate layer or a heat seal layer on the substrate layer.

<Intermediate Layer>

An intermediate layer may be provided between the substrate layer and the heat seal layer. The intermediate layer comprises a thermoplastic resin, and may be a single layer or multiple layers. By providing an intermediate layer, the cover tape may be provided with cushioning, and the adhesive force between the substrate layer and the heat seal layer may be strengthened. While the thermoplastic resin used in the intermediate layer is not particularly limited, it may be chosen as one or a mixture of two or more publicly known resins such as, for example, polyolefin resins including low-density polyethylene resins (LDPE) and various linear low-density polyethylene resins (LLDPE) polymerized by Ziegler catalysts or metallocene catalysts.

<Heat Seal Layer>

The heat seal layer is not particularly limited as long as it contains a thermoplastic resin that has heat-sealability with respect to carrier tape and exhibits an easy-peel property enabling it to be easily peeled at the time of use. For example, an ionomer resin, an acid-modified polyolefin resin, an ethylene-(meth)acrylic acid copolymer, an ethylene-(meth)acrylic acid ester copolymer, a polyester resin, a polyamide resin, a vinyl resin, an acrylic resin such as an acrylic or a methacrylic, an acrylic acid ester resin, a maleic acid resin, a butyral resin, an alkyd resin, a polyethylene oxide resin, a polyurethane resin and a silicone resin. Preferably, a resin mixture obtained by mixing one or more resins chosen from among ethylenic polymers such as various polyethylene resins, ethylene-vinyl acetate copolymers, ethylene-ethyl acrylate copolymers and ethylene-butene-1 random copolymers with one or more styrenic polymers such as styrene-butadiene copolymers, polystyrenes and impact-resistant polystyrenes in order to adjust the peel strength when heat-sealing to carrier tape can be used. More preferable is a resin mixture of an ethylene-butene-1 random copolymer, a styrene-butadiene copolymer and an impact-resistant polystyrene for having a continuously stable peel strength.

Furthermore, the use of a mixture blended at a ratio of 15 to 60 mass % of ethylene-butene-1 random copolymer, 30 to 80 mass % of styrene-butadiene copolymer and 3 to 15 mass % of impact-resistant polystyrene in 100 mass % of the entire resin in the heat seal layer of this resin mixture is more preferable for stability of the peel strength after being in a high-temperature high-humidity environment.

<Antistatic Layer>

The antistatic layer comprises an antistatic agent comprising (A) an ionic liquid containing a cyclic quaternary cation, (B) a quaternary ammonium salt and (C) a polyalkylene glycol, and is formed on the surface of the heat seal layer. The proportional content of the components of the antistatic layer is 10 to 80 mass %, preferably 30 to 80 mass % of component (A), 5 to 70 mass %, preferably 10 to 40 mass % of component (B) and 5 to 50 mass %, preferably 10 to 30 mass % of component (C).

Examples of the cation in the ionic liquid (hereinafter referred to simply as "(A) ionic liquid") containing (A) a cyclic quaternary nitrogen-containing cation include imidazolium cations, pyridinium cations, pyrrolidinium cations, pyrazolium cations and triazolium cations, among which imidazolium cations, pyridinium cations and pyrrolidinium cations are preferred, and imidazolium cations are more preferred for being capable of preparing numerous diverse types of ionic liquids of low melting point.

Examples of imidazolium cations include 1,3-dimethylimidazolium, 1-butyl-2,3-dimethylimidazolium, 1-butyl-3-methylimidazolium, 1-ethyl-2,3-dimethylimidazolium, 1-ethyl-3-methylimidazolium, 1-hexyl-3-methylimidazolium and 1-hexyl-3-propylimidazolium, among which 1-ethyl-3-methylimidazolium cations are particularly preferable for being available in various salts.

Examples of the anions in the (A) ionic liquid include organic acids and superstrong acids such as carboxylic acid, sulfuric acid esters, phosphoric acid esters and sulfonic acid, and inorganic acids such as phosphoric acids, hydrogen halides and perhalic acids, among which sulfuric acid esters are preferable and ethyl sulfate anions are more preferable for their antistatic properties and prevention of rust on the electronic components housed in the carrier tape.

The (A) ionic liquid in the present invention may be an ionic liquid comprising the aforementioned cations and anions. Specific examples include 1,3-dimethylimidazolium ethyl sulfate, 1-ethyl-3-methylimidazolium ethyl sulfate, 1-ethyl-3-methylimidazolium acetate, 1-butyl-3-dimethylimidazolium phosphate and 1,3-dimethylimidazolium hydrogensulfate.

The (B) quaternary ammonium salt is preferably a compound of the following Formula 1:

[Chem 1]

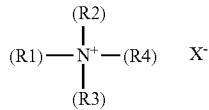

In the formula, R1 denotes an alkyl group having 10 to 20 carbon atoms or an alkenyl group having 10 to 20 carbon atoms, R2, R3 and R4 denote alkyl groups having 1 to 3 carbon atoms, and X⁻ denotes an anion. The anion X⁻ may be the same type of anion as in the (A) ionic liquid, and is preferably a sulfuric acid ester, more preferably an ethyl sulfate anion.

Specific examples of the (B) quaternary ammonium salt include trimethyl lauryl ammonium methyl sulfate, ethyl dimethyl stearyl ammonium ethyl sulfate, ethyl dimethyl oleyl ammonium ethyl sulfate, ethyl dimethyl lauryl ammonium ethyl sulfate, ethyl dimethyl stearyl ammonium metasulfonium and ethyl dimethyl lauryl ammonium methanesulfonium.

The antistatic layer used in the present invention contains a (C) polyalkylene glycol as described above. Examples include polyethylene glycol, polypropylene glycol, polybutylene glycol, polyalkylene oxides such as ethylene oxide-propylene oxide copolymers, polyether esters having ester bonds with polyoxyalkylene structures, polyether amides having amide bonds with polyoxyalkylene structures, and polyether ester amides having amide bonds and ester bonds with polyoxyalkylene structures, among which polyethylene glycol is preferable in view of the availability and closeness of contact with the heat seal layer surface of the coating film. When using polyethylene glycol, the mass average molecular weight (Mw) should preferably be in the range of 200 to 600, 300 to 500, or about 400 in view of the ease of formation of a coating film and dispersibility of ionic liquid in the film.

As described above, an antistatic layer containing an antistatic agent comprising the aforementioned components (A), (B) and (C) is formed on the surface on the heat seal layer side of the cover tape of the present invention.

As for the proportional content of each component (A), (B) and (C) in the antistatic layer, component (A) should preferably be present at 10 to 80 mass % with respect to the entire composition. At less than 10 mass %, there is a risk of it becoming difficult to obtain a surface resistivity providing an adequate antistatic effect, and at more than 80 mass %, the viscosity may increase and cause stickiness on the surface. Additionally, component (B) is preferably present at 5 to 70 mass %. At less than 5 mass %, it may become difficult to obtain sufficient antistatic properties, and at more than 70 mass %, the adhesive force of the cover tape may drop in high-temperature high-humidity environments. On the other hand, component (C) should preferably be present at 5 to 50 mass %. At less than 5 mass %, it may become difficult to form a uniform film for the antistatic layer, and at more than 50 mass %, it may become difficult to obtain sufficient peel strength when heat-sealing to carrier tape.

As is clear from the above, by forming an antistatic layer comprising three components (A), (B) and (C), the present invention provides a cover tape having good transparency and sufficient antistatic properties, capable of sufficiently suppressing the peel strength with the carrier tape when housing and storing components, even for use in high-temperature high-humidity environments, without causing any problems such as corrosion of the contents.

An antistatic layer is formed by diluting the above antistatic agent with water or an appropriate organic solvent and coating by a common method. The thickness of the antistatic layer after drying should preferably be 0.01 to 0.2 µm. At less than 0.01 µm, sufficient antistatic properties may not be able to be obtained, and at more than 0.2 µm, the heat sealability is reduced, such as with reduced peel strength. Additionally, a surface resistivity of $1\times10^{12}$ Ω/sq or less has been considered to be preferable for obtaining antistatic properties, but $1\times10^{12}$ Ω/sq or less is sometimes inadequate due to the miniaturization and higher integration of electronic components in recent years, so the cover tape requires an antistatic performance of $1\times10^{11}$ Ω/sq or less. Additionally, a low surface resistivity will never be a problem in terms of the antistatic properties, but it is not realistic to expect to achieve values of less than $1\times10^{7}$ Ω/sq by addition of an antistatic agent.

<Cover Tape>

The cover tape of the present invention has a substrate layer and a heat seal layer as mentioned above. As the method for producing the cover tape, it can be formed by a common method such as forming a heat seal layer as a single film by means of T-die extrusion or inflation, and laminating onto a substrate layer by dry lamination, or extrusion lamination via a low-density polyethylene or the like melt-extruded onto a substrate layer film. Additionally, when providing an intermediate layer between the substrate layer and the heat seal layer as mentioned above, a multimanifold or a feed block can be used to form a laminated film formed by laminating the intermediate layer and the heat seal layer, and laminating this laminated film with the substrate layer by dry lamination or sand lamination with the surface on the intermediate layer side as the lamination surface, to produce the cover tape of the present invention.

The cover tape of the present invention is used as a cover tape for transporting electronic components to cover the top surfaces of dimple portions in carrier tapes having electronic component-housing dimple portions for housing electronic components formed in a central portion in the width direction at predetermined intervals in the longitudinal direction.

<Carrier Tape>

Carrier tape is a ribbon-shaped article of width 8 mm to 100 mm having dimples for housing electronic components. When heat sealing a cover tape as a lid material, the material of the carrier tape is not particularly limited, and one that is commercially available may be used. For example, polystyrene, polyester, polycarbonate or polyvinyl chloride can be used. Additionally, the carrier tape may be made conductive by kneading carbon black or carbon nanotubes into the resin, have cationic, anionic or non-ionic surfactant-type antistatic agents or durable antistatic agents such as polyether ester amides kneaded therein, or have the surface coated with a surfactant-type antistatic agent or a coating solution having a conductor such as polypyrrole or polythiophene dispersed in an organic binder such as acryl to provide an antistatic property.

<Electronic Component Package>

A package for housing electronic components or the like is obtained, for example, by housing electronic components or the like in dimples in the carrier tape for housing electronic components, then continuously heat-sealing both edge portions in the longitudinal direction of the cover tape using a heated iron or the like with the cover tape as a lid material for packaging, and then winding the tape onto a reel. Electronic components are packaged in this form for storage and transport. The package of the present invention may be used to house and transport various electronic components such as connectors, ICs, diode, transistors, capacitors, resistors and LEDs, and are especially capable of greatly reducing problems when mounting electronic components in the case of electronic components such as LEDs, transistors and diodes of thickness 1 mm or less. The package housing electronic components or the like is advanced using holes called sprocket holes for advancing the carrier tape provided at edge portions in the longitudinal direction of the carrier tape while successively peeling away the cover tape, and the electronic components are withdrawn by a component mounting device while observing the presence, orientation and position of the electronic components to mount them onto a substrate.

<Other Examples of Use>

As other examples of use of the cover tape of the present invention, there are transports comprising polygonal punched carrier tape having polygonal punched holes for housing components, bottom cover tape for covering the bottom surfaces of polygonal holes in polygonal punched carrier tape, and top cover tape for covering the top surfaces of polygonal holes in polygonal punched carrier tape. In such transports, the cover tape for transporting electronic components of the present invention can be used as a top cover tape.

The cover tape for transporting electronic components of the present invention can be favorably used in the form of uses mentioned above to transport a wide range of chip-type electronic components including resistors such as chip-mounted resistors and capacitors such as laminated ceramic capacitors.

EXAMPLES

The present invention shall be explained in detail with reference to examples.

Example 1

A resin mixture comprising 40 parts by mass of a styrene-butadiene block copolymer having a styrene content of 80 mass % and a butadiene content of 20 mass % (Denki Kagaku Kogyo, product name Clearen), 25 parts by mass of a styrene-butadiene block copolymer with a styrene content of 40 mass % and a butadiene content of 60 mass % (JSR, product name TR Resin), 25 parts by mass of an ethylenic polymer (Mitsui Chemical, product name Tafmer-A) and 10 parts by mass of a high-impact polystyrene (Toyo Styrene H870) was prepared, kneaded at 210° C. using a uniaxial extruder of diameter 40 mm and extruded by a T-die process to produce a film of thickness 30 μm for use in a heat seal layer.

This film and a biaxially stretched polyethylene terephthalate film were extrusion sand laminated with a melted low-density polyethylene to produce a laminated film. A liquid (0.5 mass % solution) obtained by diluting an antistatic agent comprising 30 mass % of an imidazolium salt (component A) (1-ethyl-3-methylimidazolium ethyl sulfate, Tokyo Chemical Industry), 40 mass % of a quaternary ammonium salt (component B) (ethyl dimethyl laurylammonium ethylsulfate, NOF Elegan 264 wax) and 30 mass % of a polyethylene glycol (component C) (Mw=400) by 200 times in purified water was applied as an antistatic agent to both surfaces of the laminated film to a dry thickness of about 0.1 μm, then dried to obtain a cover tape.

Example 2

A cover tape was produced in the same way as Example 1, except that an antistatic agent comprising 80 mass % of an imidazolium salt (1-ethyl-3-methylimidazolium ethyl sulfate, Tokyo Chemical Industry), 10 mass % of a quaternary ammonium salt (ethyl dimethyl laurylammonium ethylsulfate, NOF Elegan 264 wax) and 10 mass % of a polyethylene glycol (Mw=400) was used.

Example 3

A cover tape was produced in the same way as Example 1, except that an antistatic agent comprising 30 mass % of an imidazolium salt (1-ethyl-3-methylimidazolium ethyl sulfate, Tokyo Chemical Industry), 40 mass % of a quaternary ammonium salt (ethyl dimethyl oleylammonium ethylsulfate) and 30 mass % of a polyethylene glycol (Mw=400) was used.

Example 4

A cover tape was produced in the same way as Example 1, except that an antistatic agent comprising 30 mass % of an imidazolium salt (1-ethyl-3-methylimidazolium ethyl sulfate, Tokyo Chemical Industry), 40 mass % of a quaternary ammonium salt (ethyl dimethyl laurylammonium ethylsulfate, NOF Elegan 264 wax) and 30 mass % of a polyethylene glycol (Mw=400) was used.

Comparative Example 1

A cover tape was produced in the same way as Example 1, except that an antistatic agent comprising 70 mass % of a quaternary ammonium salt (ethyl dimethyl laurylammonium ethylsulfate, NOF Elegan 264 wax) and 30 mass % of a polyethylene glycol (Mw=400) was used.

Comparative Example 2

A cover tape was produced in the same way as Example 1, except that an antistatic agent comprising 70 mass % of an imidazolium salt (1-ethyl-3-methylimidazolium ethyl sulfate, Tokyo Chemical Industry) and 30 mass % of a polyethylene glycol (Mw=400) was used.

Comparative Example 3

A cover tape was produced in the same way as Example 1, except that an antistatic agent comprising 60 mass % of an imidazolium salt (1-ethyl-3-methylimidazolium ethyl sulfate, Tokyo Chemical Industry) and 40 mass % of a quaternary ammonium salt (ethyl dimethyl laurylammonium ethylsulfate, NOF Elegan 264 wax) was used.

Comparative Example 4

A cover tape was produced in the same way as Example 1, except that an anionic antistatic agent (Upon LS-250, Lion) was used as the antistatic agent.

Comparative Example 5

A cover tape was produced in the same way as Example 1, except that a zwitterionic antistatic agent (Nissananon BF, NOF) was used as the antistatic agent.

Comparative Example 6

A cover tape was produced in the same way as Example 1, except that a metal oxide-containing acrylic resin (Neocon Coat 565DR-2, Dainichiseika) was coated as the antistatic agent on only the heat seal layer side of the same laminated film as Example 1 to a thickness after drying of about 0.1 μm.

Comparative Example 7

A cover tape was made in the same way as Example 1 except that only 1-ethyl-3-methylimidazolium chloride (Tokyo Chemical Industry) was used as the antistatic agent.

This cover tape had stickiness on the antistatic layer formed on the surface of the heat seal layer and had problems in practical application such as adhesion to contents.

(Evaluation Method)

Cover tapes produced in the above-described examples and comparative examples were used to make the following evaluations and the results of the evaluations are shown together in Table 1.

(1) Surface Resistivity Measurement

A Mitsubishi Chemical Hiresta UPMCP-HT450 was used to measure the surface resistivity on the heat seal layer side surface and substrate layer side of the cover tape using the method of JIS K6911 in an environment of 23° C. and relative humidity 50%, applied voltage 500 V and measurement time 60 seconds. While a surface resistivity of $1\times10^{12}$ Ω/sq or less has conventionally been considered preferable, the miniaturization and higher integration of electronic components in recent years has made a surface resistivity of $1\times10^{11}$ Ω/sq or less necessary.

(2) Peel Strength

A carrier tape was produced by heat sealing a cover tape prepared as described above to a carrier tape of width 24 mm formed by a Denka EC sheet (thickness 0.4 mm) using a heat sealer under conditions of iron width 0.5 mm×2, pressure 0.34 MPa, time 0.5 seconds and two sealings, and the peel strength was measured at a speed of 300 mm/minute. Those with a peel strength of less than 0.4 N even when sealed at a seal temperature of 160° C. had insufficient peel strength for practical use and sometimes became peeled during transport.

(3) Peel Strength Stability in High-Temperature High-Humidity Environment

A carrier tape was produced by heat sealing in the same way as in section (2) above. The peel strength of the taped product was measured after seven days of storage at high-temperature high-humidity (60° C., relative humidity 90%), then letting stand for 24 hours at a constant temperature and constant humidity (23° C., relative humidity 50%). Those with a peel strength of less than 0.4 N did not have sufficient peel strength for practical use, and the housed components sometimes spilled out.

(4) Metal Corrosion

In a progressive environment (60° C., relative humidity 90%), a small piece of kovar was placed on the heat seal layer surface of a cover tape, and the appearance of the surface of contact with the cover tape was observed every 24 hours. Observations were performed with a stereo microscope at 20-times magnification, with the occurrence of reddish-brown discolorations compared to the surface not contacting the cover tape being observed, and the time elapsed until the occurrence being measured. The observations were performed up to 396 hours. It has been confirmed that if no discolorations are observed for more than 336 hours in the progressive environment, similar discolorations will not be observed for one year when actually put on the market.

The evaluation results for the examples and comparative examples are shown together in Table 1.

| (Antistatic Layer Composition) (mass %) | | Ex 1 | Ex 2 | Ex 3 | Ex 4 | Comp Ex 1 | Comp Ex 2 | Comp Ex 3 | Comp Ex 4 | Comp Ex 5 | Comp Ex 6 | Comp Ex 7 |
|---|---|---|---|---|---|---|---|---|---|---|---|---|
| Component A | 1-ethyl-3-methyl imidazolium ethyl sulfate | 30 | 80 | 30 | 30 | | 70 | 60 | | | | |
| | 1-ethyl-3-methyl imidazolium chloride | | | | | | | | | | | 100 |
| Component B | Ethyl dimethyl lauryl ammonium ethyl sulfate | 40 | 10 | | 40 | 70 | | 40 | | | | |
| | Ethyl dimethyl oleyl ammonium ethyl sulfate | | | 40 | | | | | | | | |
| Component C | Polyethylene glycol (Mw: 400) | 30 | 10 | 30 | | 30 | 30 | | | | | |
| | Polyethylene glycol (Mw: 1000) | | | | 30 | | | | | | | |
| Anionic Antistatic Agent | | | | | | | | | 100 | | | |
| Zwitterionic Antistatic Agent | | | | | | | | | | 100 | | |
| Metal Oxide (Acrylic Binder) | | | | | | | | | | | 100 | |
| (Properties) | | | | | | | | | | | | |
| Surface Resistivity (Ω/sq) | Substrate Layer Side (Ω/sq) | $1\times10^9$ | $4\times10^9$ | $3\times10^9$ | $5\times10^9$ | $2\times10^9$ | $2\times10^{11}$ | $1\times10^{10}$ | $5\times10^9$ | $7\times10^{10}$ | | $1\times10^9$ |
| | Heat Seal Layer Side (Ω/sq) | $1\times10^9$ | $4\times10^9$ | $3\times10^9$ | $5\times10^9$ | $2\times10^9$ | $5\times10^{11}$ | $2\times10^{10}$ | $5\times10^9$ | $8\times10^{10}$ | $8\times10^9$ | $1\times10^9$ |
| Peel Strength | Standard (N) | 0.5 | 0.5 | 0.5 | 0.5 | 0.5 | 0.5 | 0.5 | 0.1 | 0.5 | 0.5 | 0.5 |
| | Hi Temp Hi Humidity (N) | 0.5 | 0.5 | 0.5 | 0.4 | 0 | 0.5 | 0 | 0 | 0.5 | 0.5 | 0.5 |
| Metal Corrosion | Time Until Corrosion (h) | none | none | none | none | none | none | none | none | 120 | none | 72 |

INDUSTRIAL APPLICABILITY

The cover tape of the present invention is a cover tape having transparency that can be easily peeled from carrier tape, having good antistatic effects and being capable of notably suppressing corrosion of contents having metal portions such as ICs in high-temperature high-humidity environments, and therefore can be used not only as a cover tape for electronic component transporters for transporting and storing electronic components such as ICs having metal portions, but also for the transport of a wide range of chip-type electronic components including resistors such as chip-mounted resistors and capacitors such as laminated ceramic capacitors.

The invention claimed is:

1. A cover tape comprising at least a substrate layer, a heat seal layer and an antistatic layer, wherein
the heat sealing layer has a first surface and a second surface, where the first surface of the heat seat layer is located closer to the substrate layer than the second surface, the antistatic layer comprises (A) an ionic liquid containing a cyclic quaternary nitrogen-containing cation, (B) a quaternary ammonium salt and (C) a polyalkylene glycol, and is formed on the second surface of the heat seal layer, and (C) the polyalkylene glycol is at least one of
polyethylene glycol,
polypropylene glycol,
polybutylene glycol,
polyalkylene oxides,
polyether amides having amide bonds with polyoxyalkylene structures, or
polyether ester amides having amide bonds and ester bonds with polyoxyalkylene structures.

2. The cover tape according to claim 1, wherein anions in (A) the ionic liquid containing a cyclic quaternary nitrogen-containing cation and (B) the quaternary ammonium salt are of one or more types chosen from the group consisting of carboxylic acids, sulfuric acid esters, phosphoric acid esters, sulfonic acids and phosphoric acids.

3. The cover tape according to claim 1, wherein the antistatic layer contains the respective components (A), (B) and (C) at the following ratios:
Component (A): 10 to 80 mass %;
Component (B): 5 to 70 mass %; and
Component (C): 5 to 50 mass %.

4. The cover tape according to claim 1, wherein (A) the ionic liquid containing a cyclic quaternary nitrogen-containing cation is an imidazolium salt.

5. The cover tape according to claim 1, wherein the cations in (B) the quaternary ammonium salt have one alkyl group or alkenyl group having 10 to 20 carbon atoms.

6. The cover tape according to claim 1, wherein (C) the polyalkylene glycol is a polyethylene glycol having a mass-average molecular weight (Mw) of 200 to 600.

7. The cover tape according to claim 1, wherein the thickness of the antistatic layer formed on the second surface of the heat seal layer is 0.01 to 0.2 μm.

8. An electronic component package using the cover tape according to claim 1.

9. The cover tape according to claim 1, wherein the antistatic layer consists essentially of (A) the ionic liquid containing a cyclic quaternary nitrogen-containing cation, (B) the quaternary ammonium salt and (C) the polyalkylene glycol.

10. The cover tape according to claim 1, wherein the antistatic layer consists of (A) the ionic liquid containing a cyclic quaternary nitrogen-containing cation, (B) the quaternary ammonium salt and (C) the polyalkylene glycol.

11. The cover tape according to claim 1, wherein (C) the polyalkylene glycol is polypropylene glycol.

12. The cover tape according to claim 1, wherein (C) the polyalkylene glycol is polybutylene glycol.

13. The cover tape according to claim 1, wherein (C) the polyalkylene glycol is selected from polyalkylene oxides.

14. The cover tape according to claim 1, wherein (C) the polyalkylene glycol is selected from polyether amides having amide bonds with polyoxyalkylene structures.

15. The cover tape according to claim 1, wherein (C) the polyalkylene glycol is selected from polyether ester amides having amide bonds and ester bonds with polyoxyalkylene structures.

* * * * *